(12) United States Patent
Satoh (10) Patent No.: US 11,705,896 B2
(45) Date of Patent: Jul. 18, 2023

(54) APPARATUSES AND METHODS FOR DELAY MEASUREMENT INITIALIZATION

(71) Applicant: MICRON TECHNOLOGY, INC., Boise, ID (US)

(72) Inventor: Yasuo Satoh, Ibaraki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/540,846

(22) Filed: Dec. 2, 2021

(65) Prior Publication Data

US 2023/0179192 A1   Jun. 8, 2023

(51) Int. Cl.
*H03K 5/135* (2006.01)
*H03L 7/081* (2006.01)
*G11C 7/22* (2006.01)

(52) U.S. Cl.
CPC ............ *H03K 5/135* (2013.01); *G11C 7/222* (2013.01); *H03L 7/0814* (2013.01)

(58) Field of Classification Search
None
See application file for complete search history.

(56) References Cited

U.S. PATENT DOCUMENTS

| | | | |
|---|---|---|---|
| 10,700,689 B2 | 6/2020 | Satoh | |
| 2006/0279342 A1* | 12/2006 | Blodgett | H03L 7/10 327/158 |
| 2008/0144423 A1* | 6/2008 | Kwak | G11C 7/22 327/158 |
| 2008/0189568 A1* | 8/2008 | Kwak | G11C 7/1072 327/158 |

* cited by examiner

*Primary Examiner* — Cassandra F Cox
(74) *Attorney, Agent, or Firm* — Dorsey & Whitney LLP (57) ABSTRACT

Apparatuses and methods of DLL measurement initialization are disclosed. An example apparatus includes: a clock enable circuit that provides a first clock signal having a half frequency of an input clock signal and second clock signals having a quarter frequency of the input clock signal; a coarse delay that provides the first clock signal with a coarse delay; a fine delay that provides the first clock signal with the coarse delay and a fine delay as an output clock signal; a model delay having a feedback delay equivalent to a sum of delays of an input stage and an output stage, and provides a feedback signal that is the output clock signal with the feedback delay; and a measurement initialization circuit that performs measurement initialization. The measurement initialization circuit includes synchronizers that receive the feedback signal and the second clock signals, and provide a stop signal to the coarse delay.

21 Claims, 9 Drawing Sheets

APPARATUSES AND METHODS FOR DELAY MEASUREMENT INITIALIZATION

BACKGROUND

High data reliability, high speed memory access, lower power consumption and reduced chip size are features that are demanded from semiconductor memory. To achieve higher memory access speed, operational timing in the semiconductor memory is adjusted using a clock signal as a reference signal.

When an external clock signal enters into a circuit, the clock phase of internal clock signals based on the external clock signal may be delayed because of the inherent delay of the components of the circuit. At high operating speeds, distortions in a clock signal duty cycle may adversely affect the functioning of the circuit. To accommodate these delays and distorting effects, a clock path may include a delay circuit. The clock phase may be adjusted to match the phase of the external clock using a delay circuit such as a delay locked loop ("DLL"). Conventional DLLs may include a coarse delay that provides a coarser resolution of delay adjustment and a fine delay line that provides a finer resolution of delay adjustment.

To adjust the clock phase, measurement of the coarser resolution of delay adjustment may be performed. When a power is turned on, the DLL may perform initialization of the measurement. During the initialization, the DLL may include a detector that detects a number of cycles that is longer than the inherit delay. The coarser resolution may be adjusted to have a delay that matches a difference between the number of cycles and the inherent delay. The DLL may include a synchronizer in a circuit that instructs a detection timing to the detector. When an asynchronous signal is transmitted to a circuit that functions with synchronous signals, in order to cross to a synchronous domain the asynchronous signal may be synchronized. The synchronizer may receive a signal and provide the signal having a timing of the reference signal. The synchronizer may include a flip-flop (FF). As known, a FF may have a setup time before receiving the signal. However, the FF may receive the signal before the setup is complete. As a result, an output node of the FF may be in a metastable state and the FF may provide the synchronized signal with a delay. To avoid this metastable state, an additional one or more FFs may be coupled in series to the first FF. By adding such FF(s), a setup time of the additional FF(s) coupled to the first FF may be ensured even if the output signal of the first FF has a delay while resolving the metastable state, and consequently, the signal may be properly synchronized. However, a metastable state of the additional FF will eventually cause a failure, which can be measured as a meantime between failures (MTBF) of the synchronizer. The MTBF is known to be reduced exponentially based on a difference between one cycle of an input clock signal and a setup time of the additional FF. To alleviate failure by increasing the MTBF of the synchronizer, the input clock signal of the synchronizer with a longer cycle is desired.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
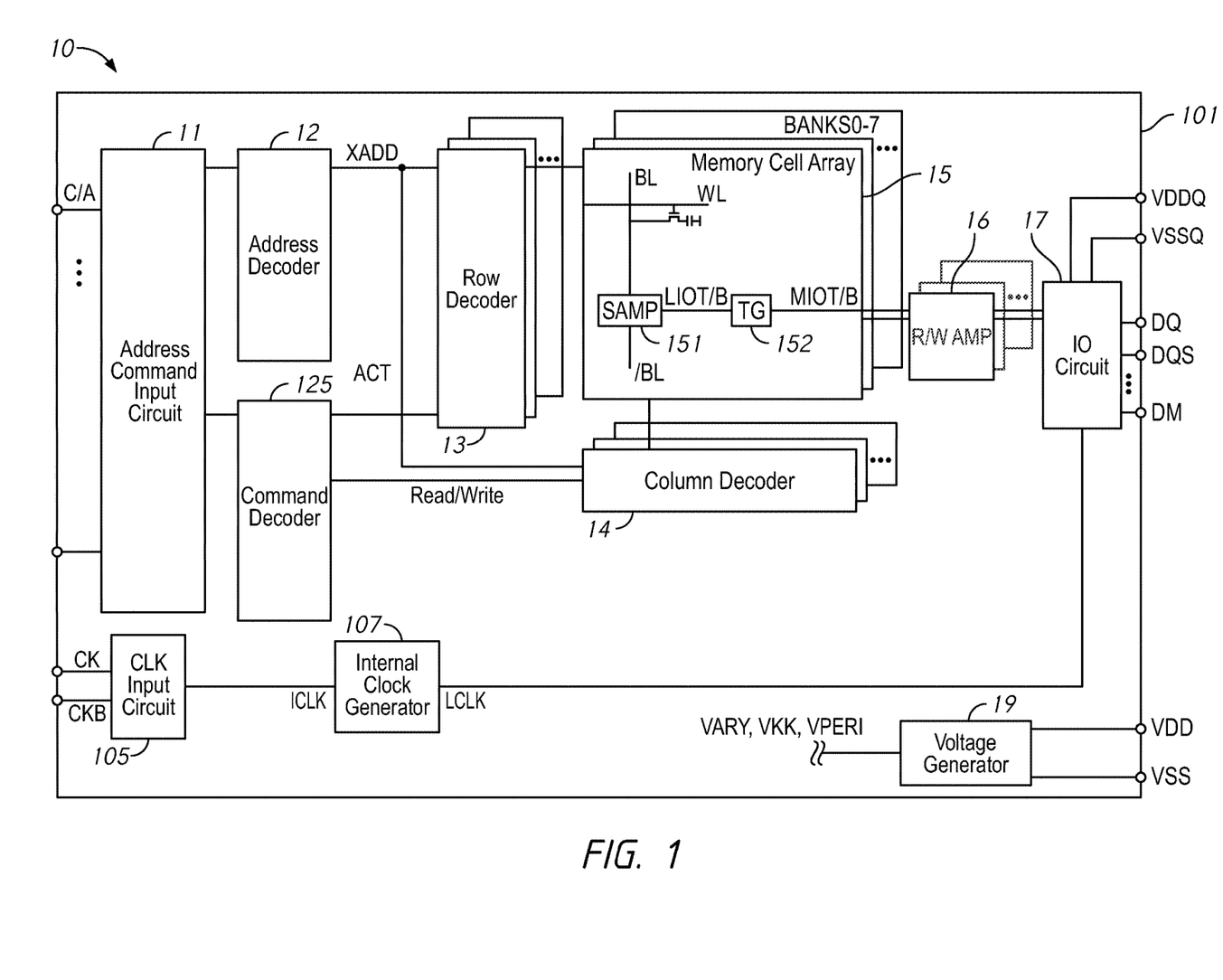
FIG. 1 is a schematic block diagram of a semiconductor device in accordance with an embodiment of the present disclosure.

FIG. 1 is a schematic block diagram of a chip 101 of a semiconductor memory device 10, in accordance with an embodiment of the present disclosure. In some embodiments, the semiconductor memory device 10 is an apparatus that may include a plurality of chips, including the chip 101. The chip 101 may include a clock input circuit 105, an internal clock generator 107, a command and address input circuit 11, an address decoder 12, a command decoder 125, a plurality of row decoders 13, a memory cell array 15 including sense amplifiers 151 and transfer gates 152, a plurality of column decoders 14, a plurality of read/write amplifiers 16, an input/output (IO) circuit 17, and a voltage generator circuit 19. The semiconductor memory device 10 may include a plurality of external terminals including address and command terminals coupled to command/address buses, clock terminals CK and CKB, data terminals DQ, a data strobe terminal DQS, and a data mask terminal DM and power supply terminals VDD, VSS, VDDQ, and VSSQ.

The memory cell array 15 includes a plurality of banks (e.g., Banks0-7), each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 13 and the selection of the bit line BL is performed by a corresponding column decoder 14.

The plurality of sense amplifiers SAMP 151 are located for their corresponding bit lines BL and coupled to at least one respective local I/O line (e.g., LIOT/B) further coupled to a respective one of at least two main I/O line pairs (e.g., MIOT/B), via transfer gates TG 152, which function as switches.

The command and address input circuit 11 may receive an address signal and a bank address signal from outside at the command/address terminals via the command/address bus (C/A) and transmit the address signal and the bank address signal to the address decoder 12. The address decoder 12 may decode the address signal received from the command and address input circuit 11 and provide address signals ADD. The address signals ADD may include a row address signal to the row decoder 13, and a column address signal to the column decoder 14. The address decoder 12 may also receive the bank address signal and provide the bank address signal to the row decoder 13 and the column decoder 14.

The command and address input circuit 11 may receive a command signal from outside at the command/address terminals via the command/address buses and provide the command signal to the command decoder 125. The command decoder 125 may decode the command signal and provide generate various internal command signals. For example, the internal command signals may include a row command signal to select a word line, a column command signal, such as a read command or a write command, to select a bit line.

Accordingly, when an activation command is issued and a row address is timely supplied with the activation command, and a read command is issued and a column address is timely supplied with the read command, read data is read from a memory cell in the memory cell array 15 designated by the row address and the column address. The read/write amplifiers 16 may receive the read data and provide the read data to the IO circuit 17. The IO circuit 17 may provide the read data to outside via the data terminals DQ together with a data strobe signal at the data strobe terminal DQS and a data mask signal at the data mask terminal DM. Similarly, when the activation command is issued and a row address is timely supplied with the activation command, and a write command is issued and a column address is timely supplied with the write command, the IO circuit 17 may receive write data at the data terminals DQ, DQS, DM, together with a data strobe signal at DQS and a data mask signal at DM and provide the write data via the read/write amplifiers 16 to the memory cell array 15. Thus, the write data may be written in the memory cell designated by the row address and the column address.

Turning to the explanation of the external terminals included in the semiconductor device 10, the clock terminals CK and CKB may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK. In some embodiments, a DLL circuit may be used as the internal clock generator 107. The internal clock generator 107 may provide the phase controlled internal clock signal LCLK to the IO circuit 17. The IO circuit 17 may use the phase controlled internal clock signal LCLK as a timing signal for determining an output timing of read data.

The power supply terminals may receive power supply voltages VDD and VSS. These power supply voltages VDD and VSS may be supplied to a voltage generator circuit 19. The voltage generator circuit 19 may generate various internal voltages, VKK, VARY, VPERI, and the like based on the power supply voltages VDD and VSS. The internal voltage VKK may be used in the row decoder 13, the internal voltage VARY may be used in the sense amplifiers 151 included in the memory cell array 15, and the internal voltage VPERI is used in many other circuit blocks. The power supply terminals may also receive power supply voltages VDDQ and VSSQ. The IO circuit 17 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 17.

Figure 2:
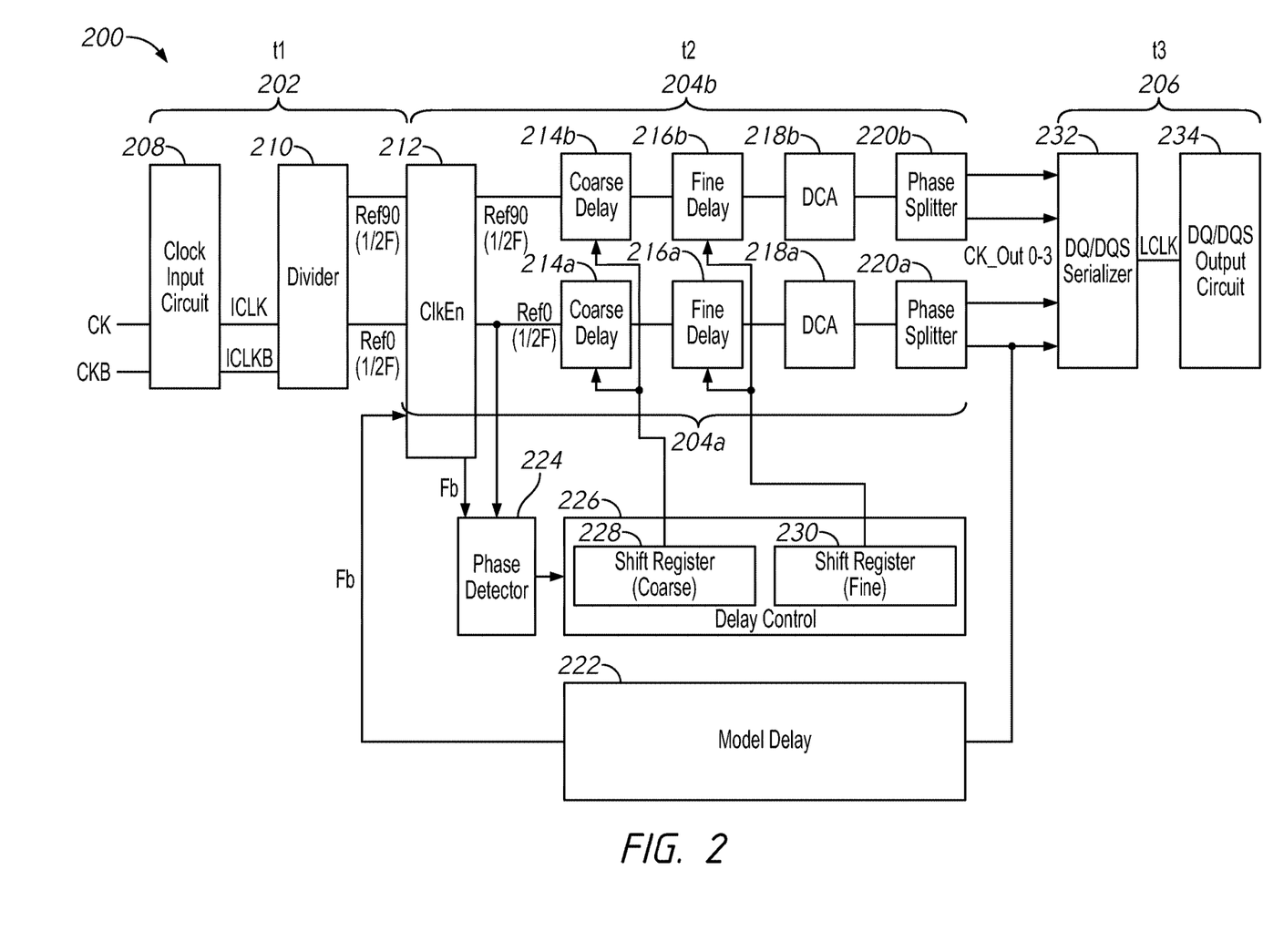
FIG. 2 is a block diagram of a DLL circuit in a semiconductor device according to an embodiment of the present disclosure.

In a semiconductor device with high speed memory access, the read data to be provided on the data terminals DQ and the data strobe signal at the data strobe terminal DQS need to be in synchronization with the external clock signals CK and CKB. FIG. 2 is a block diagram of a DLL circuit 200 in accordance with an embodiment of the present disclosure. In some embodiments of the disclosure, the DLL circuit 200 may be the DLL circuit used as the internal clock generator 107. The DLL circuit 200 may include an input stage 202, an output stage 206 and delay stages 204a and 204b coupled in parallel between the input stage 202 and the output stage 206. The DLL circuit 200 may further include a model delay 222 and a phase detector 224 coupled between an output node and an input node of the delay stage 204a.

The input stage 202 may include a clock input circuit 208 and a divider 210. In some embodiments, the clock input circuit 208 may be the clock input circuit 105 of FIG. 1. The divider 210 may receive an internal clock signal ICLK and its complementary signal ICLKB from the clock input circuit 208 that are based on the external clock signals CK and CKB during a normal operation. The divider 210 may provide clock signals Ref0 and Ref90 having a frequency that is a half of a frequency of the internal clock signal ICLK. The clock signal Ref90 is delayed from the clock signal Ref0 by a phase difference of about 90°. The delay stages 204a and 204b may include a clock enable circuit 212. The clock enable circuit 212 may receive the clock signals Ref0 and Ref90 and provide the clock signals Ref0 and Ref90. The clock enable circuit 212 may enable or disable to provide some of the clock signals (e.g., Ref90) depending on whether the DLL circuit is in the normal operation or in a measurement initialization operation.

The delay stage 204a may include a delay line that provides the clock signal Ref0 from the clock enable circuit 212 and provides the clock signal Ref0 having an adjustable delay as an output clock signal. For example, the delay line includes a coarse delay 214a and a fine delay 216a coupled in series. The coarse delay 214a receives the clock signal Ref0 from the clock enable circuit 212. The coarse delay 214a is a variable (e.g., adjustable) delay having a coarse (e.g., relatively large) step size of delay adjustment. The fine delay 216a is another variable delay having fine (e.g., relatively small) step size of delay adjustment that is smaller than the coarse step size of the coarse delay 214a. The delay stage 204a may further include a duty cycle adjustment circuit 218a and a phase splitter 220a. The duty cycle adjustment circuits 218a may adjust a duty cycle of the clock signal Ref0 delayed by the coarse delay 214a and the fine delay 216a. The phase splitter 220a may provide an output clock signal CK_Out 0 and its complementary clock signal CK_Out 2 based on the delayed clock signal Ref0 after duty cycle adjustment by the duty cycle adjustment circuit 218a. Similarly, the delay stage 204b may include a coarse delay 214b and a fine delay 216b coupled in series. The coarse delay 214b receives the clock signal Ref90 from the clock enable circuit 212. The coarse delay 214b is a variable delay having a coarse (e.g., relatively large) step size of delay adjustment, and the fine delay 216b is a variable delay having a fine (e.g., relatively small) step size of delay adjustment. The delay stage 204b may further include a duty cycle adjustment circuit 218b and a phase splitter 220b. The phase splitter 220b may provide an output clock signal CK_Out 1 and its complementary clock signal CK_Out 3 based on the delayed clock signal Ref90 after the duty cycle adjustment by the duty cycle adjustment circuit 218b. The output clock signals CK_Out 0-3 from the delay stages 204a and 204b may be provided to the output stage 206.

The output stage 206 may include a data queue/data queue strobe serializer 232 and data queue/data queue output circuit 234. The data queue/data queue strobe serializer 232 may receive the output clock signals CK_Out 0-3 and serialize the output clock signals CK_Out 0-3 into an internal clock signal LCLK. The internal clock signal LCLK may be provided, for example, to the data queue/data queue strobe output circuit 234 in the IO circuit 17. The internal clock signal LCLK can be used as a reference signal for controlling timings of providing read data DQ and a data strobe signal DQS in FIG. 1.

The output clock signal CK_Out 0 from the delay stage 204a may be also supplied to the model delay 222. The model delay 222 may represent a delay equivalent to a sum of delays on a clock path, such as a sum of a delay t1 in the input stage 202 and a delay t3 in the output stage 206. In some embodiments, the model delay 222 may represent the sum of a delay by the clock input circuit 105 and a delay by the IO circuit 17 in FIG. 1. A feedback signal Fb from the model delay 222 may be provided to the phase detector 224 through the clock enable circuit 212. The phase detector 224 may detect a phase shift between the feedback signal Fb and the clock signal Ref0, and provide a phase shift signal to a delay control circuit 226. Responsive to the phase shift signal, the delay control circuit 226 may provide control signals. The delay control circuit 226 may include a shift register (coarse) 228 and a shift register (fine) 230. The shift register (coarse) 228 may store an amount of delay in a coarse resolution and provide a control signal representing the amount of delay to the coarse delays 214a and 214b. The shift register (fine) 230 may store an amount of delay in a fine resolution and provide a control signal representing the amount of delay to the fine delays 216a and 216b. The sum of delay t2 including the delay amounts of the coarse delay 214a and the fine delay 216a is adjusted in a manner that a total sum of the delays t1, t2 and t3 becomes multiple cycles (N*tCK) of the clock signal Ref0.

When a phase of the feedback signal Fb from the model delay 222 is lagging a phase of the clock signal Ref0, the delay of the delay stages 204a and 204b may be decreased. On the other hand, if the phase of the feedback signal Fb from the model delay 222 is leading the phase of the clock signal Ref0, the delay of the delay stages 204a and 204b may be increased. Each of the delay stages 204a and 204b may be controlled to lock the phase of the feedback signal Fb in synchronization with the phase of the clock signal Ref0. Each of the coarse delays 214a and 214b may include a plurality of delay units coupled in series to provide even/odd input clock signals to the fine delays 216a and 216b, respectively. Here, the odd clock signal may be provided from a selected odd numbered one of the plurality of delay units and the even clock signal may be provided from a selected even numbered one of the plurality of delay units. The odd and even numbers are consecutive numbers. The even/odd input clock signals may have a phase difference relative to one another, responsive to the control signal from the shift register (coarse) 228. The fine delays 216a and 216b may further receive the control signal from the shift register (fine) 230. The fine delays 216a and 216b may provide the locked clock signal, responsive to the even/odd input clock signals and the fine control signals. Respective locked clock signals are provided to the duty cycle adjustment circuits 218a and 218b and further to the phase splitters 220a and 220b, respectively, to provide the internal clock signal LCLK, as described above for duty cycle adjustment and serialization. Thus, the read data and the data strobe signal DQS timed by the internal clock signal LCLK may be in synchronization with the external clock signals CK and CKB.

Figure 3:
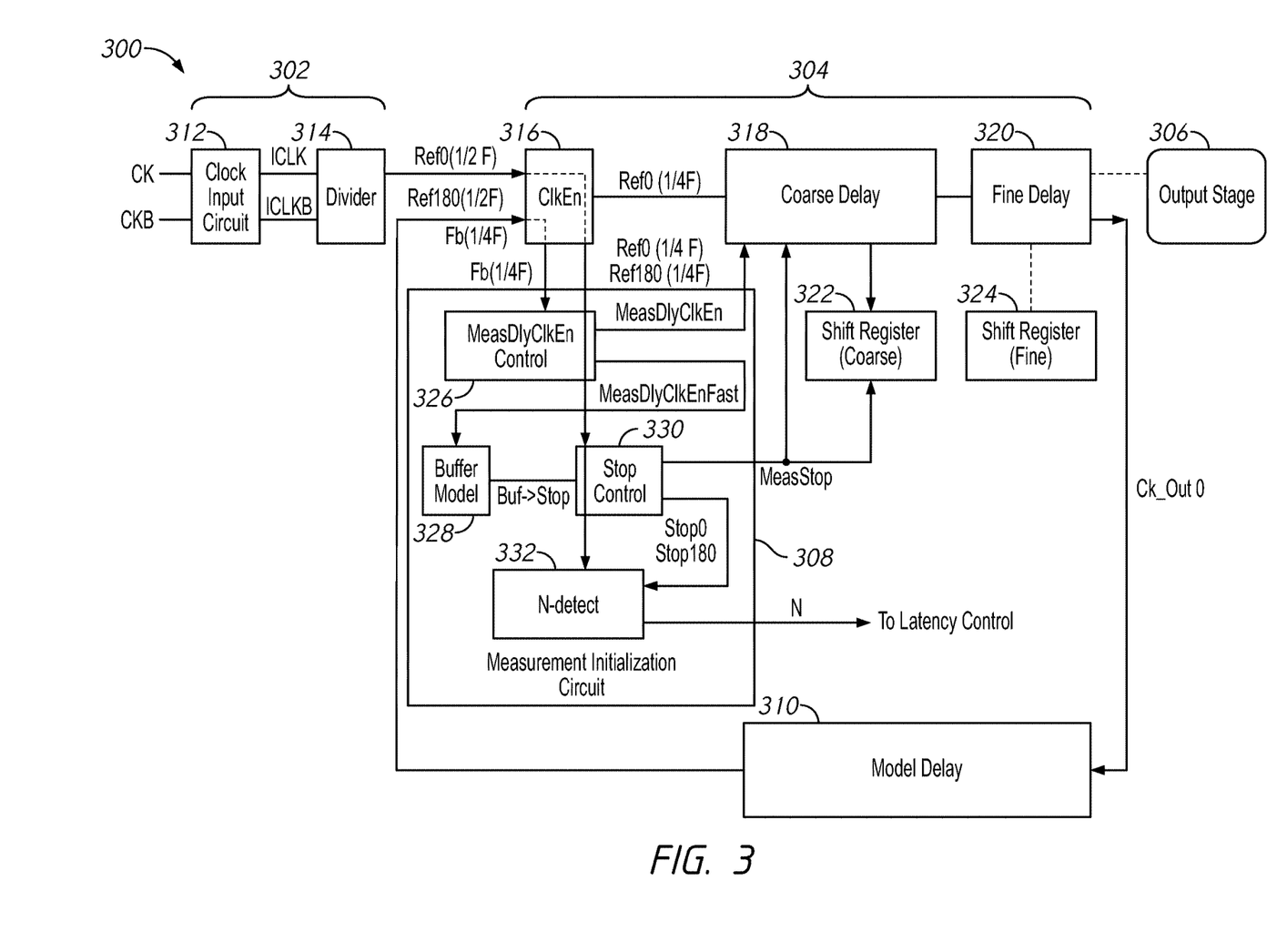
FIG. 3 is a block diagram of a DLL circuit in a semiconductor device including a measurement initialization circuit according to an embodiment of the present disclosure.

FIG. 3 is a block diagram of a DLL circuit 300 in a semiconductor device including a measurement initialization circuit 308 according to an embodiment of the present disclosure. The measurement initialization circuit 308 is used for a measurement initialization operation. In some embodiments of the disclosure, the DLL circuit 300 may be the DLL circuit used as the internal clock generator 107.

The DLL circuit 300 may include an input stage 302, an output stage 306 and a delay stage 304 coupled between the input stage 302 and the output stage 306. The output stage 306 may provide the internal clock signal LCLK. The output stage 306 is similar to the output stage 206 as earlier described with reference to FIG. 2, thus a detailed description of the output stage 306 is not provided in the interest of brevity.

The input stage 302 may include a clock input circuit 312 and a divider 314. In some embodiments, the clock input circuit 312 may be the clock input circuit 105 of FIG. 1. The divider 314 may receive an internal clock signal ICLK and its complementary signal ICLKB from the clock input circuit 312 that are based on the external clock signals CK and CKB. The divider 314 may provide clock signals Ref0(½F) and Ref180(½F) having a frequency that is a half of the frequency of the internal clock signal ICLK. The clock signal Ref180(½F) is delayed from the clock signal Ref0 (½F) by a phase difference of about 180°, which is one cycle of the internal clock signal ICLK.

The delay stage 304 may receive the clock signal Ref0 (½F) from the divider 314. The delay stage 304 may include a clock enable circuit 316, and a delay line including a coarse delay 318 and a fine delay 320 coupled in series. In some embodiments, the clock enable circuit 316 is similar to the clock enable circuit 212, the coarse delay 318 is similar to the coarse delay 214a, and the fine delay 320 is similar to the fine delay 216a of FIG. 2. The clock enable circuit 316 may receive the clock signals Ref0(½F) and Ref180(½F) from the divider 314. The clock enable circuit 316 may provide the clock signal Ref0(¼F) by dividing the clock signal Ref0(½F) to activate the coarse delay 318. The clock signal Ref0(¼F) has a frequency that is one-fourth of the frequency of the internal clock signal ICLK. The coarse delay 318 has a coarse (e.g., relatively large) step size of delay adjustment and the fine delay 320 has a fine (e.g., relatively small) step size of delay adjustment. An output clock signal CK_Out 0 from the fine delay 320 may be provided to the output stage 306. The coarse delay 318 may be coupled to a shift register (coarse) 322 and the fine delay 320 may be coupled to a shift register (fine) 324. At the end of the initialization operation, the shift register (coarse) 322 and the shift register (fine) 324 may store delay amounts of the coarse delay 318 and the fine delay 320, respectively. The measurement initialization process is performed to initialize the coarse delay 318.

The DLL circuit 300 may further include a model delay 310 between an output node and input node of the delay stage 304. The output clock signal CK_Out 0 from the delay stage 304 may be supplied to the model delay 310. The model delay 310 may represent a delay equivalent to a sum of delays on a clock path, such as a sum of a delay in the input stage 302 and a delay in the output stage 306. In some embodiments, the model delay 310 may represent the sum of a delay by the clock input circuit 105 and a delay by the IO circuit 17 in FIG. 1. A feedback signal Fb of the model delay 310 may be provided to the clock enable circuit 316.

The clock enable circuit 316 may further provide the clock signal Ref0(¼F) and a clock signal Ref180(¼F) to the measurement initialization circuit 308 by dividing the clock signals Ref0(½F) and Ref180(½F) from the divider 314. The clock signal Ref180(¼F) also has a frequency that is one-fourth of the frequency of the internal clock signal ICLK. The clock signal Ref180(¼F) is delayed from the clock signal Ref0(¼F) by a phase difference of about 180° of the clock signal(½F), which is one cycle of the internal clock signal ICLK. The clock enable circuit 316 may also provide the feedback signal Fb from the model delay 310 to the measurement initialization circuit 308. The measurement initialization circuit 308 may include a measurement delay clock enable control circuit 326, a buffer model 328, a stop control circuit 330 and a multiple cycle (N) detect circuit 332. The measurement delay clock enable control circuit 326, the buffer model 328 and the stop control circuit 330 together with the coarse delay 318 may perform DLL measurement initialization. While the DLL measurement initialization is being performed, the multiple cycle (N) detect circuit 332 may perform the multiple cycle (N) detection.

Figure 4:
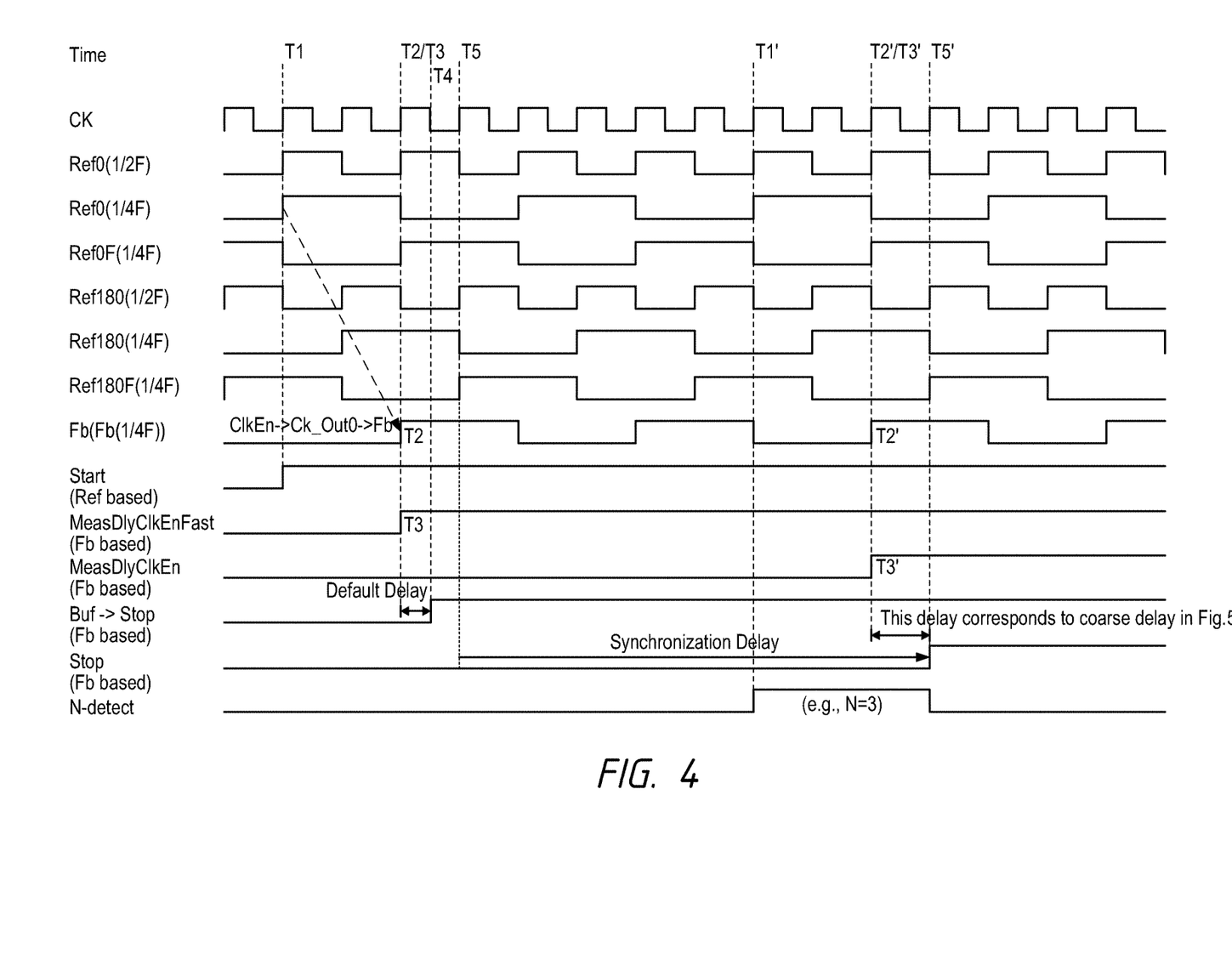
FIG. 4 is a timing diagram of various signals during the measurement initialization operation of the DLL circuit according to the embodiment of FIG. 3.

FIG. 4 is a timing diagram of various signals during a measurement initialization operation according to an embodiment. The measurement initialization operation will be described with reference to for the DLL circuit 300 of FIG. 3. However, the measurement initialization operation of FIG. 4 is not limited to the DLL circuit 300, and in some embodiments of the disclosure, the measurement initialization operation of FIG. 4 is utilized with other timing circuits.

A time sequence of the measurement initialization operation and functionality of each circuit and/or component in the measurement initialization circuit 308 will be described below along the timing diagram of FIG. 4. At T1, the measurement initialization operation starts. As described earlier, the coarse delay 318 provides no active delay at T1. The clock enable circuit 316 receives the clock signal Ref0(½F) from the divider 314. After diving the clock signal Ref0(½F), the clock signal Ref0(¼F) may be provided from the clock enable circuit 316 to the coarse delay 318 and further to the fine delay 320. The coarse delay 318 and the fine delay 320 at T1 may not have a delay amount. An output clock signal from the fine delay 320 may be provided as the output clock signal CK_out 0 signal to the model delay 310. The model delay 310 may provide the feedback signal Fb responsive to the output clock signal CK_out 0. Relative to the Ref0(¼F) clock signal, the feedback signal Fb includes the delays of the inherent delay of the delay stage 306 and the model delay 310.

At the same time, the multiple cycle (N) detection may be started by the clock enable circuit 316 providing the clock signals Ref0(¼F) and Ref180(¼F) to the measurement initialization circuit 308 responsive to the clock signals Ref0(½F) and Ref180(½) from the divider 314. The clock signals Ref0(¼F) and Ref180(¼F) may be provided to the multiple cycle (N) detect circuit 332. Responsive to the clock signal Ref0(¼F) and Ref180(¼F), start signal Start in the multiple cycle (N) detect circuit 332 is activated at T1 and the measurement initialization operation is executed. The start signal Start may be responsive to the clock signal Ref0(¼F). The detection of the multiple cycle (N) starts at T1' after a synchronization delay (e.g., two cycles of Ref0 (¼F)) from T1, responsive to the start signal.

At T2, the feedback signal Fb may be provided through the clock enable circuit 316 to the measurement delay clock enable control circuit 326. At T3, the measurement delay clock enable control circuit 326 may provide a measurement delay clock enable signal MeasDlyClkEnFast to the buffer model 328, responsive to the feedback signal Fb. In some embodiments, time T3 is immediately after time T2. In FIG. 4, the times T2 and T3 are substantially the same.

Responsive to the measurement delay clock enable signal MeasDlyClkEnFast, the buffer model 328 may be activated at T4 in order to provide a default delay amount for the coarse delay 318 to the stop control circuit 330. The default delay amount may be used to prevent the coarse delay 318 from underflow if the coarse delay 318 is decreased during delay adjustment of the measurement initialization. In some embodiments, the default delay amount may be about a few steps of the coarse delay 318. Thus, a signal (Buf→Stop) from the buffer model 328 to the stop control circuit 330 may lag from the measurement delay clock enable signal MeasDlyClkEn by the default delay amount.

Figure 5A:
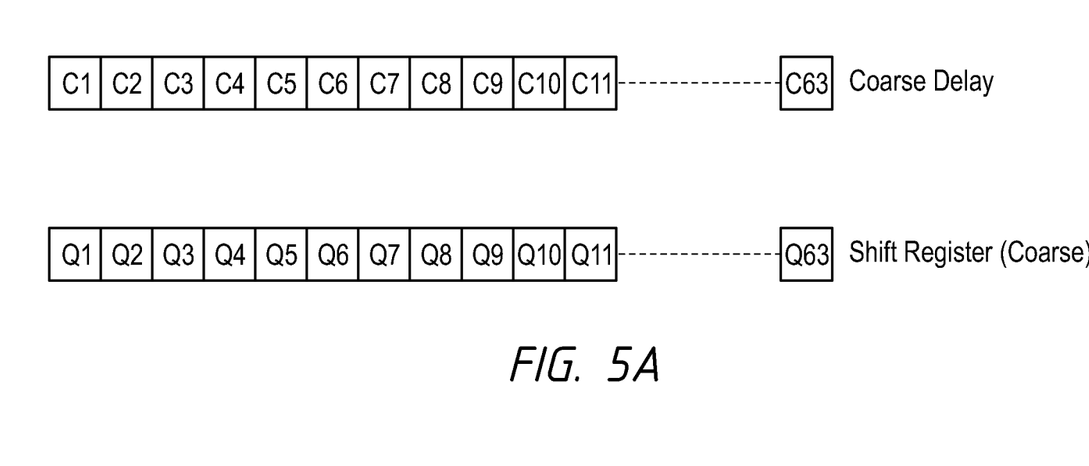
FIG. 5A is a schematic diagram of a coarse delay and a shift register (coarse) before the initialization operation of FIG. 3.

The stop control circuit 330 may receive the signal (Buf→Stop) from the buffer model 328 and the clock signals Ref0(¼F) and Ref180(¼F) from the clock enable circuit 316. Responsive to the signal (Buf→Stop) from the buffer model 328 and either a rising edge or a falling edge of any of the clock signals Ref0(¼F) and Ref180(¼F), the stop control circuit 330 may provide active stop signals Stop0 and Stop180, and further provide a stop signal MeasStop to the coarse delay 318 and the shift register (coarse) 322 responsive to the stop signals Stop0 and Stop180 at T5' that is after a synchronization delay (e.g., two cycles of Ref180F (¼F)) from T5. In the example of FIG. 4, the stop control circuit 330 provides the active stop signal Stop180 at T5' responsive to the first rising edge of the clock signal Ref180F(¼F) immediately after the rising edge of the signal (Buf→Stop) from the buffer model 328 with the synchronization delay. A delay amount for the coarse delay 318 may be measured from T2'/T3' after the synchronization delay from T2/T3 when another measurement delay clock enable signal MeasDlyClkEn provided to the coarse delay 318 is activated until T5'. FIG. 5A is a schematic diagram representing activated delay steps of the coarse delay 318 and corresponding registers included in the shift register (coarse) 322 at T1 before the initialization operation of FIG. 3. Prior to the measurement initialization, the coarse delay 318 may have no additional delay with all of steps C1-C63 deactivated. The shift register (coarse) 322 has all registers Q1-Q63 storing a value indicative of an inactive state. In this example, a number of 63 steps are included; however, the number of steps may not be limited to 63. Any number of steps suitable to control the coarse delay 318 may be used to implement the shift register (coarse) 322.

Figure 5B:
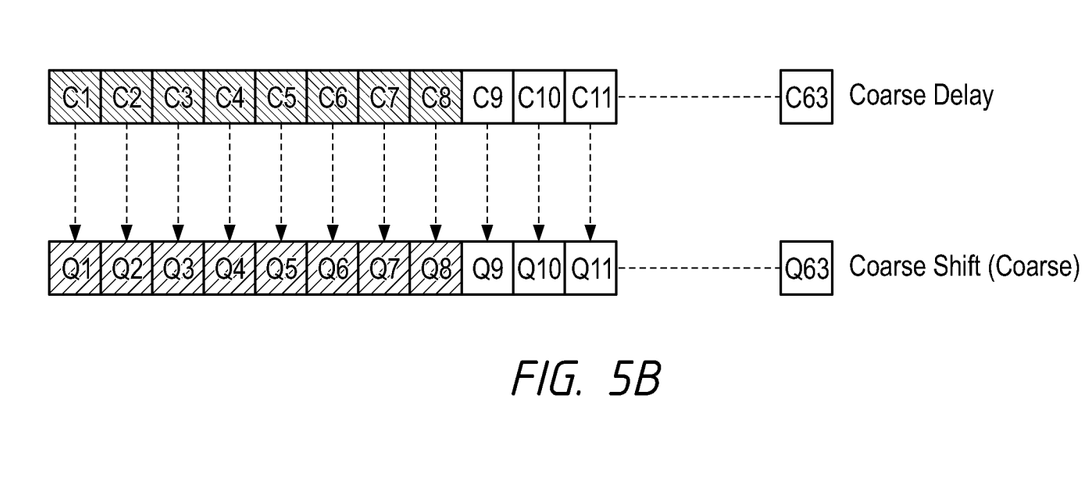
FIG. 5B is a schematic diagram of the coarse delay and the shift register (coarse) after the initialization operation of FIG. 3.

FIG. 5B is a schematic diagram representing activated delay steps of the coarse delay 318 and corresponding registers included in the shift register (coarse) 322 at T5 after the initialization operation of FIG. 4. After the measurement initialization, the stop control circuit 330 may further provide another stop signal MeasStop that may signal an earliest activation of the stop signals Stop0 and Stop180 to the coarse delay 318. The coarse delay 318 may stop adjusting its delay to have an initial delay amount responsive to the stop signal MeasStop. In the example of FIG. 5B, the coarse delay 318 may have the initial delay amount with delay steps C1-C8 activated and C9-C63 deactivated. The shift register (coarse) 322 may store the initial delay amount of the coarse delay 318 in corresponding registers. For example, the shift register (coarse) 322 may include registers Q1-Q8 storing a value of an active state reflecting the initial delay amount of the coarse delay 318 and registers Q9-Q63 storing the value indicative of the inactive state. The initial delay amount of the coarse delay 318 may include a difference between a period of the number of cycles N and the delay represented by the model delay 310. Thus, the initial delay amount may be set to the shift register (coarse) 322.

Furthermore, the stop signals Stop0 and Stop180 may be provided to the multiple cycle (N) detect circuit 332. Responsive to the activation of the stop signals Stop0 and Stop180, the multiple cycle (N) detect circuit 332 may stop counting a number of cycles N of the internal clock signal ICLK at T5'. In the example of FIG. 4, the stop signal may be the stop signal Stop180 responsive to a rising edge of the clock signal Ref180F(¼F), and the number of cycles N from T1' to T5' is 3. The number of cycles N of the internal clock signal ICLK may be provided to several circuits for latency control.

Figure 6:
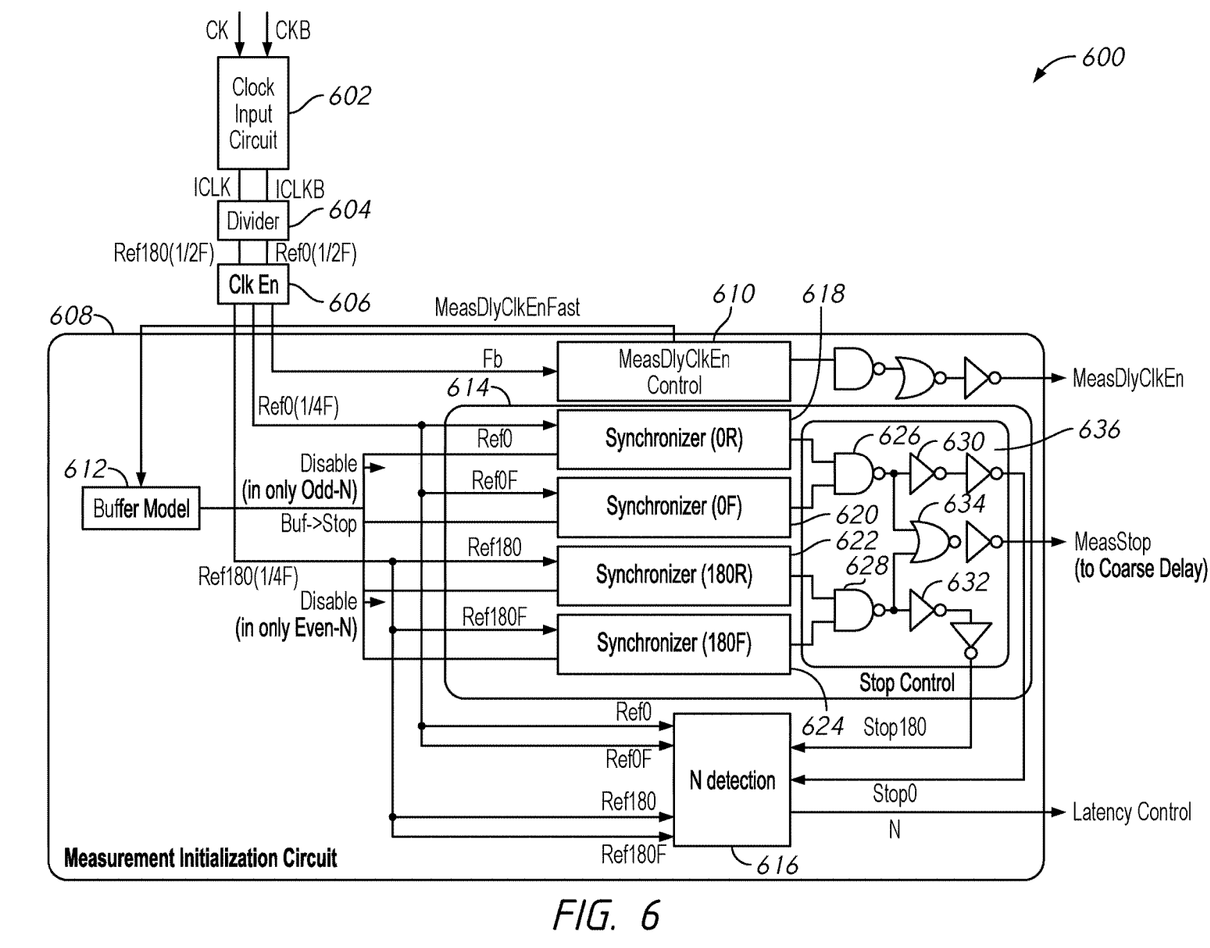
FIG. 6 is a schematic diagram of a DLL circuit in a semiconductor device including a measurement initialization circuit according to an embodiment of the present disclosure.

FIG. 6 is a schematic diagram of a measurement initialization circuit 608 according to an embodiment of the present disclosure.

In some embodiments of the disclosure, the measurement initialization circuit 608 may be included in a DLL circuit used as the internal clock generator 107. FIG. 6 shows a clock input circuit 602, a divider 604, and a clock enable circuit 606 coupled in series, and the measurement initialization circuit 608 coupled to the clock enable circuit 606. The clock input circuit 602, the divider 604, and the clock enable circuit 606 together may provide the clock signals Ref0(¼F) and Ref180(¼F) as earlier described with referring to the clock input circuit 312, the divider 314 and the clock enable circuit 316 of FIG. 3. Thus, the description of the clock input circuit 602, the divider 604, and the clock enable circuit 606 is not repeated. The clock enable circuit 606 may also provide the feedback signal Fb from a model delay (e.g., the model delay 310) to the measurement initialization circuit 608.

The measurement initialization circuit 608 may include a measurement delay clock enable control circuit 610, a buffer model 612, a stop control circuit 614 and a multiple cycle (N) detect circuit 616. The measurement delay clock enable control circuit 610 and the buffer model 612 may be the measurement delay clock enable control circuit 326 and the buffer model 328 earlier described with referring FIG. 3. Thus, the description of the measurement delay clock enable control circuit 610 and the buffer model 612 is not repeated. The stop control circuit 614 may receive the signal (Buf→Stop) from the buffer model 612 and the clock signals Ref0(¼F) and Ref180(¼F) from the clock enable circuit 606. The stop control circuit 614 may also receive complementary clock signals Ref0F(¼F) and Ref180F(¼F) of the clock signals Ref0(¼F) and Ref180(¼F). The measurement initialization circuit 608 may include inverters that may invert the clock signals Ref0(¼F) and Ref180(¼F) to generate the complementary clock signals Ref0F(¼F) and Ref180F(¼F). In some embodiments, the inverters may be included between the clock enable circuit 606 and the stop control circuit 614. In some embodiments, the inverters may be included in the stop control circuit 614.

Responsive to the signal (Buf→Stop) from the buffer model 612 and any of the clock signals Ref0(¼F), Ref0F(¼F), Ref180(¼F) and Ref180F(¼F), the stop control circuit 614 may provide a stop signal MeasStop to a coarse delay (e.g., the coarse delay 318). The stop control circuit 614 may further provide a stop signal Stop0 responsive to the signal (Buf→Stop) from the buffer model 612 and any of the clock signals Ref0(¼F) and Ref0F(¼F). The stop control circuit 614 may also provide a stop signal Stop180 responsive to the signal (Buf→Stop) from the buffer model 612 and any of the clock signals Ref180(¼F) and Ref180F(¼F). The stop signals Stop0 and Stop180 may be provided to the multiple cycle (N) detect circuit 616. Responsive to the activation of the stop signals Stop0 and Stop180, the multiple cycle (N) detect circuit 616 may stop counting a number of cycles N of the internal clock signal ICLK as described referring to FIG. 4. The number of cycles N of the internal clock signal ICLK may be provided to several circuits for latency control.

In some embodiments, the stop control circuit 614 may include synchronizers 618, 620, 622 and 624. The synchronizers 618, 620, 622 and 624 may receive the clock signals Ref0(¼F), Ref0F(¼F), Ref180(¼F) and Ref180F(¼F), respectively. The stop control circuit 614 may further include a synchronization detector circuit 636 including logic circuits 626, 628, 634 and inverters 630 and 632. The synchronizers 618, 620, 622 and 624 may also receive the signal (Buf→Stop). Furthermore, the synchronizers 618 and 620 may receive an active disable signal when a multiple cycle N is odd, and the synchronizers 622 and 624 may receive an active disable signal when the multiple cycle N is even. The synchronizer 618 may provide a first stop signal responsive to the signal (Buf→Stop) and the clock signal Ref0(¼F) while the multiple cycle N is even. The synchronizer 620 may provide a second stop signal responsive to the signal (Buf→Stop) and the clock signal Ref0F(¼F) while the multiple cycle N is even. The logic circuit 626 (e.g., a NAND logic) may receive the first stop signal and the second stop signal and provide a complementary signal of the stop signal Stop0 that is inverted by the inverter 630 and further inverted by another inverter coupled to an output node of the inverter 630, and provided as the stop signal Stop0 to the multiple cycle (N) detect circuit 616. Similarly, the synchronizer 622 may provide a third stop signal responsive to the signal (Buf→Stop) and the clock signal Ref180(¼F) while the multiple cycle N is odd. The synchronizer 624 may provide a fourth stop signal responsive to the signal (Buf→Stop) and the clock signal Ref180F(¼F) while the multiple cycle N is odd. The logic circuit 628 (e.g., a NAND logic) may receive the third stop signal and the fourth stop signal and provide a complementary signal of the stop signal Stop180 that is inverted by the inverter 632 and further inverted by another inverter coupled to an output node of the inverter 632, and provided as the stop signal Stop180 to the multiple cycle (N) detect circuit 616. The logic circuit 634 (e.g., a NOR logic) that receives complementary signals of the stop signals Stop0 and Stop180 and provides an output signal. The output signal is further inverted by another inverter coupled to an output node of the logic circuit 634 and provided as the stop signal MeasStop.

Figure 7:
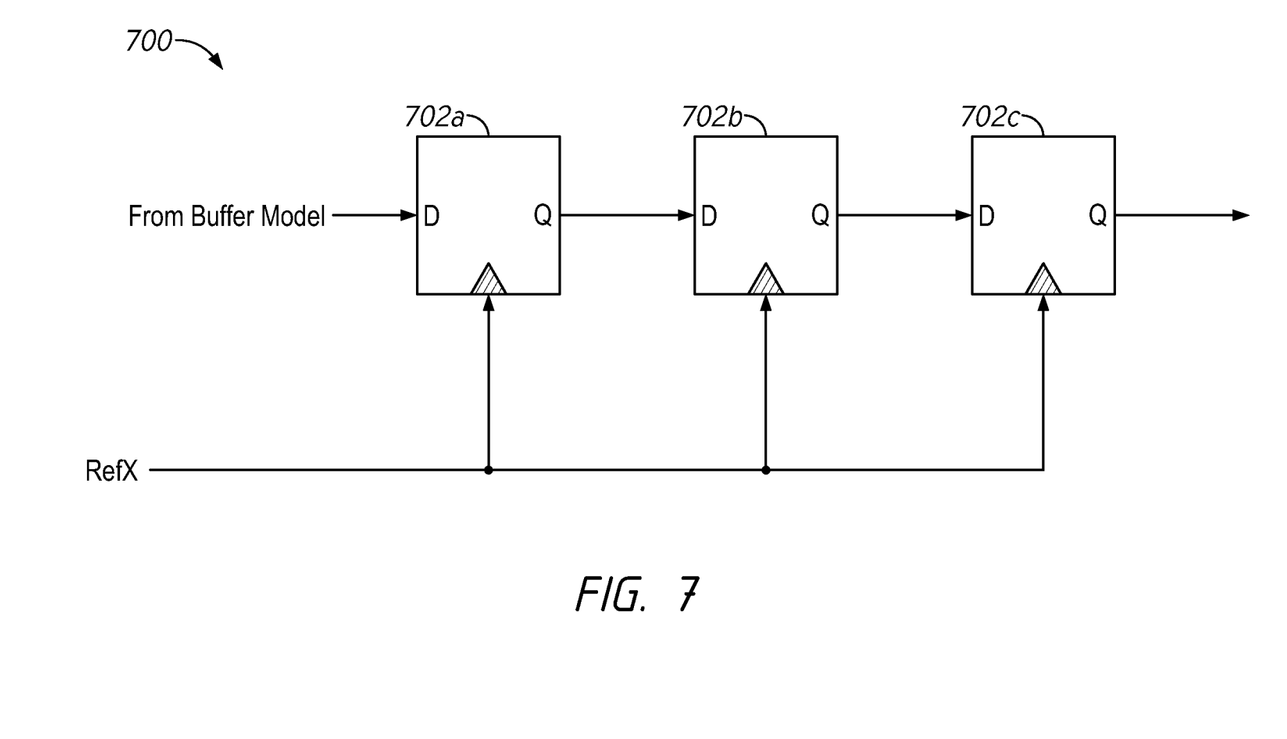
FIG. 7 is a circuit diagram of a synchronizer according to an embodiment of the present disclosure.

FIG. 7 is a circuit diagram of a synchronizer 700 according to an embodiment of the present disclosure. In some embodiments of the disclosure, the synchronizer 700 may be included in the synchronizers 618, 620, 622 and 624. However, the synchronizers 618, 620, 622 and 624 are not be limited to the synchronizer 700, and may be implemented differently. The synchronizer 700 may include a plurality of flip-flops 702a, 702b and 702c coupled in series. In this example, a number of flip-flops may be three; however, the number of the plurality of flip-flops used in each synchronizer may not be limited to three. The plurality of flip-flops 702a to 702c may receive a common reference clock signal RefX at their clock nodes. For example, the reference clock signal RefX may be any of the clock signals Ref0(¼F), Ref0F(¼F), Ref180(¼F) and Ref180F(¼F). The flip-flop 702a may receive the signal (Buf→Stop) from a buffer model (e.g., the buffer model 328 or the buffer model 612) at an input node D. The flip-flop 702a may provide the received signal at the input node D as an output signal to an output node Q responsive to the common reference clock signal RefX. The flip-flop 702b may receive the output signal of the flip-flop 702a at the input node D and provide the received signal as an output signal to an output node Q responsive to the common reference clock signal RefX. The flip-flop 702c may receive the output signal of the flip-flop 702b at the input node D and provide the received signal as an output signal to an output node Q responsive to the common reference clock signal RefX. Thus, the synchronizer 700 may provide the signal (Buf→Stop) clocked by the RefX signal.

Figure 8:
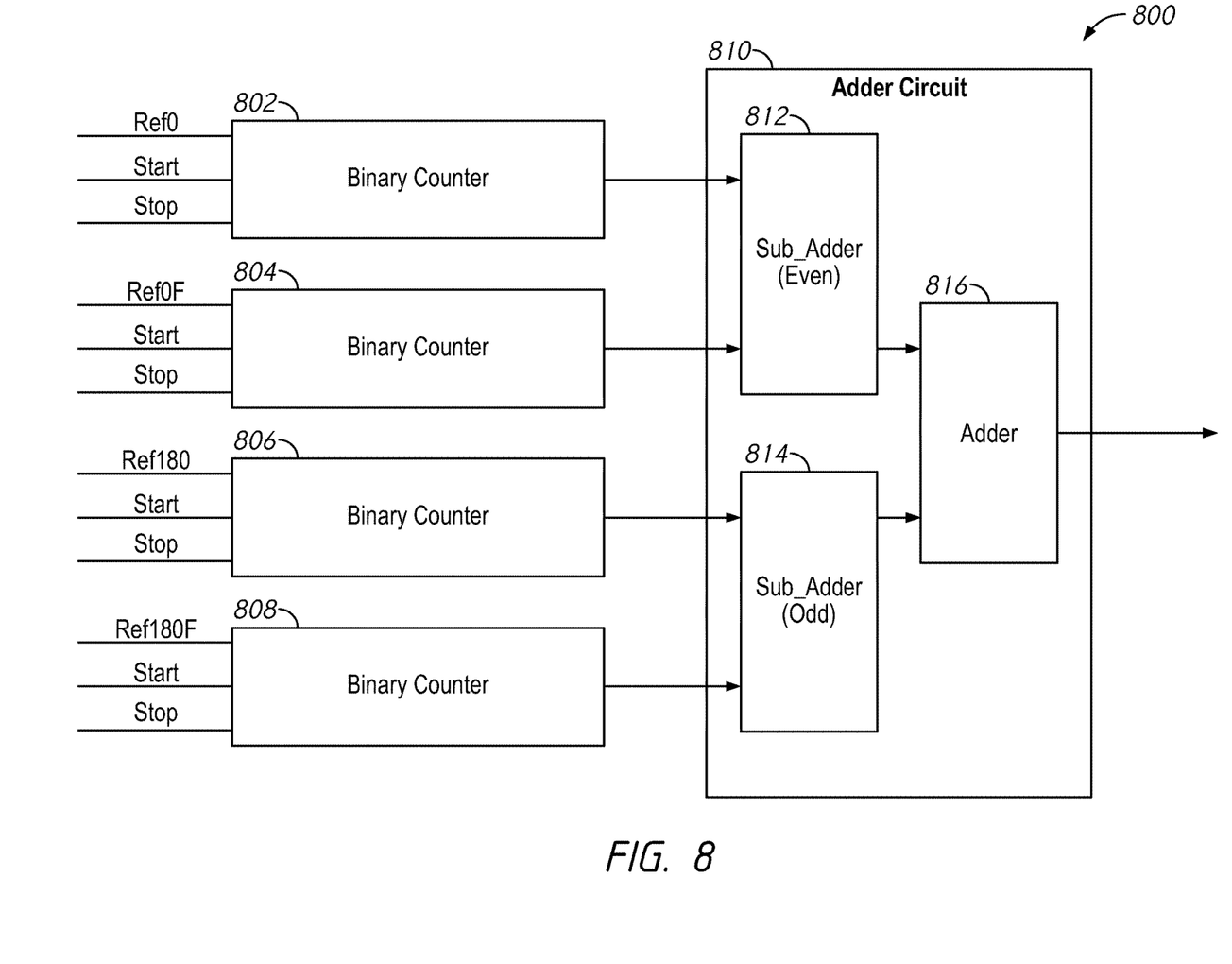
FIG. 8 is a block diagram of a multiple cycle (N) detect circuit according to an embodiment of the present disclosure.

FIG. 8 is a block diagram of a multiple cycle (N) detect circuit 800 according to an embodiment of the present disclosure. In some embodiments of the disclosure, the multiple cycle (N) detect circuit 800 may be included in the multiple cycle (N) detect circuit 332 of FIG. 3 or the multiple cycle (N) detect circuit 616 of FIG. 6. However, the multiple cycle (N) detect circuit 332 and the multiple cycle (N) detect circuit 616 are not limited to the multiple cycle (N) detect circuit 800, and may be implemented differently. The multiple cycle (N) detect circuit 800 may include a plurality of counters 802, 804, 806 and 808. The counters 802, 804, 806 and 808 may be implemented as binary counters. Alternatively, the counters may be implemented as shift registers. The counter 802 may receive the clock signal Ref0 (e.g., the clock signal Ref0(¼F)) and the stop signal (Stop0). The counter 802 may also receive a start signal that may be generated from the clock signal Ref0. Similarly, the counter 804 may receive the clock signal Ref0F (e.g., the clock signal Ref0F(¼F)), the stop signal (Stop0) and another start signal that may be generated from the clock signal Ref0F. The counter 806 may receive the clock signal Ref180 (e.g., the clock signal Ref180(¼F)), another stop signal (Stop180) and another start signal that may be generated from the clock signal Ref180. The counter 808 may receive the clock signal Ref180F (e.g., the clock signal Ref180F(¼F)), the another stop signal (Stop180) and another start signal that may be generated from the clock signal Ref180F. Each counter of the counters 802, 804, 806 and 808 may start counting a number of cycles responsive to the respective start signal with a cycle timed by the respective clock signal (e.g., Ref0, Ref0F, Ref180, Ref180F) and stop counting the number of cycles responsive to the corresponding stop signal.

The multiple cycle (N) detect circuit 800 may include an adder circuit 810. The adder circuit 810 may include sub adders 812 and 814 and an adder 816. The sub adder 812 may receive the numbers of cycles from the counters 802 and 804 and provide an added result. The sub adder 814 may receive the numbers of cycles from the counters 806 and 808 and provide an added result. The adder 816 may receive the added results from the sub adders 812 and 814 and provide an added result of the received added results as a number of cycles N, such as the number of cycle N that may be provided for latency control.

Figure 9:
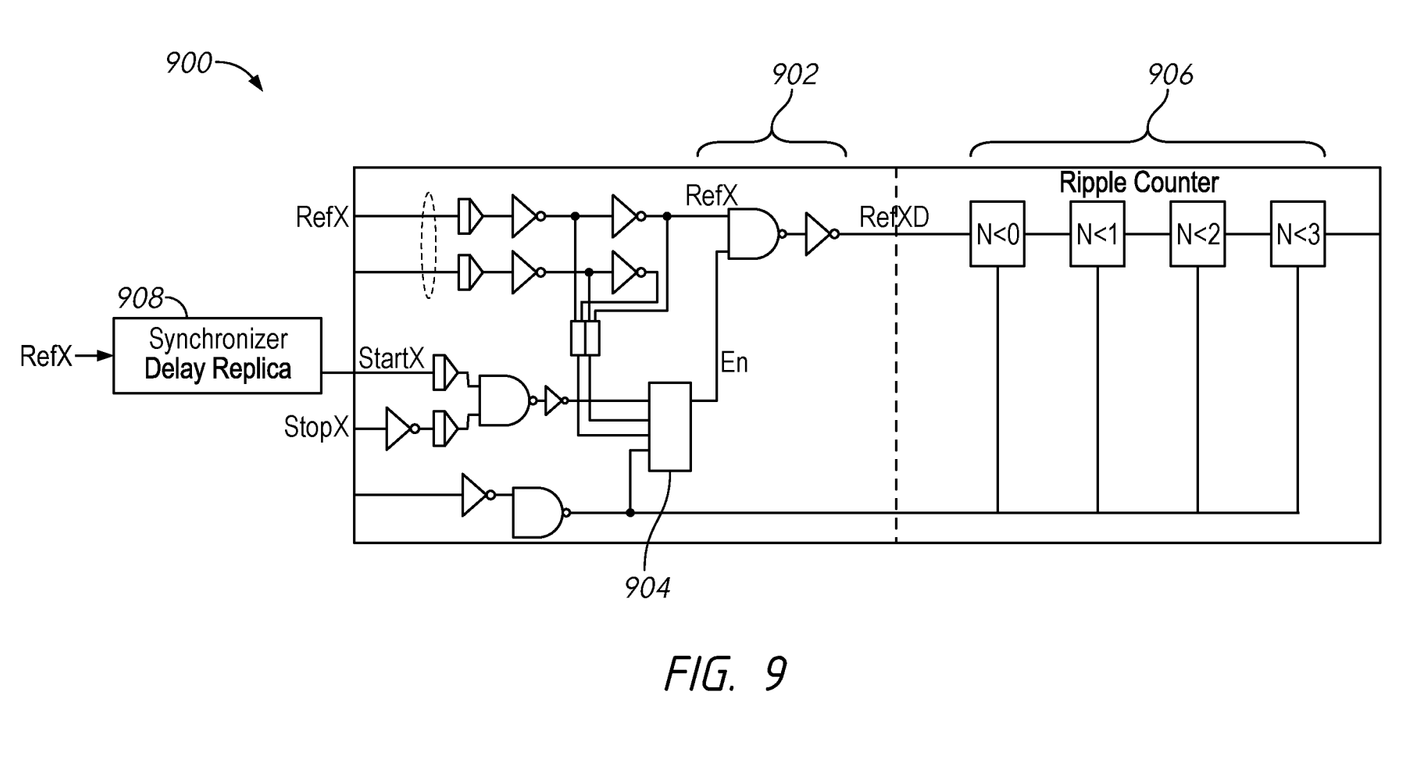
FIG. 9 is a circuit diagram of a binary counter according to an embodiment of the present disclosure.

FIG. 9 is a circuit diagram of a binary counter 900 according to an embodiment of the present disclosure. In some embodiments of the disclosure, the binary counter 900 may be included in the counters 802, 804, 806 and 808 of FIG. 8. The binary counter 900 includes a logic circuit 902, an enable circuit 904, a ripple counter 906 and a synchronizer delay replica 908. The binary counter 900 may receive a clock signal RefX. The clock signal RefX may be one of the clock signals Ref0 and Ref180, respectively. In some embodiments, the synchronizer delay replica 908 may include a delay equivalent to the delay on the synchronizers 618, 620, 622 and 624 and a latch. In some embodiments, the delay of the synchronizer delay replica 908 may be implemented including the synchronizer 700 and a latch. The synchronizer delay replica 908 may receive the clock signal RefX, delaying the clock signal RefX and the latch may provide a start signal StartX responsive to the delayed clock signal RefX. The enable circuit 904 may receive the start signal StartX and an inverted signal of a stop signal StopX. The stop signal StopX may be one of the stop signals Stop0 and Stop180. The enable circuit 904 may provide an enable signal En responsive to the start signal StartX and the stop signal StopX. For example, the enable signal En may have a rising edge responsive to a rising edge of the start signal StartX and a falling edge responsive to a falling edge of the inverted signal of the stop signal StopX. Thus, the enable signal En may have an active state from the rising edge of the start signal StartX to the rising edge of the stop signal StopX.

The logic circuit 902 may also receive the clock signal RefX. The clock input buffer 902 may further receive the enable signal En. Responsive to the clock signal RefX and the enable signal En, the logic circuit 902 may provide a clock signal RefXD during the active state of the enable signal En.

The ripple counter 906 may include a plurality of flip-flops in series representing a binary code N<3-0> that is a number of cycles N in a binary manner. For example, the ripple counter 906 may include a first flip-flop storing a value N<0> that may receive the clock signal RefXD, a second flip-flop storing N<1> that may receive an output signal from the first flip-flop, a third flip-flop storing N<2> that may receive an output signal from the second flip-flop, and a third flip-flop storing N<3> that may receive an output signal from the third flip-flop. Compared to counters implemented as the shift registers, most of the flip-flops, except the flip-flop storing the value N<0>, may change their values at longer cycles than the clock cycle of the clock signal RefXD, thus signals in the ripple counter 906 may be relatively stable.

Because of including synchronizers that may receive a clock cycle longer than a clock cycle of an internal clock signal, a metastable state in each synchronizer may be prevented. In addition, a multiple cycle (N) detect circuit designed to perform with the clock cycle longer than the clock cycle of the internal clock signal, a metastable state in the multiple cycle (N) detect circuit may be prevented. Furthermore, a ripple counter in the multiple cycle (N) detect circuit may also stabilize signals representing the number of cycles N. Thus, despite relatively high clock speed of the external clock signal, measurement initiation and/or multiple cycle (N) detection may be performed in a stable manner.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
    a delay stage including:
        a clock enable circuit configured to receive first and second clock signals having a first frequency, configured to provide third and fourth clock signals having a second frequency that is a half of the first frequency;
        a delay coupled to the clock enable circuit and configured to receive the third clock signal and to provide the third clock signal having an adjustable delay as an output clock signal;
    a model delay circuit configured to receive the output clock signal and to provide the output clock signal having a model delay as a feedback signal; and
    a measurement initialization circuit comprising:
        a stop control circuit configured to provide a first stop signal to stop a measurement initialization responsive to the third and fourth clock signals and further responsive to the feedback signal, the stop control circuit comprising:
            a plurality of synchronizers configured to receive the third and fourth clock signals, and complementary clock signals of the third and fourth clock signals respectively, and further configured to provide a plurality of second stop signals,
        wherein the stop control circuit is configured to provide the first stop signal responsive to the plurality of second stop signals.

2. The apparatus of claim 1, wherein the second clock signal is delayed from the first clock signal by one cycle of the internal clock signal; and
    wherein the fourth clock signal is delayed from the third clock signal by one cycle of the internal clock signal.

3. The apparatus of claim 1, wherein each synchronizer of the plurality of synchronizers comprise a series of flip-flops.

4. The apparatus of claim 1, wherein the plurality of synchronizers comprise:
    a first synchronizer configured to receive the third clock signal;
    a second synchronizer configured to receive a complementary signal of the third clock signal;
    a third synchronizer configured to receive the fourth clock signal;
    a fourth synchronizer configured to receive a complementary signal of the fourth clock signal.

5. The apparatus of claim 4, wherein the measurement initialization circuit further comprises a buffer model configured to enable the first and second synchronizers responsive to the feedback signal and the third clock signal and further configured to enable the third and fourth synchronizers responsive to the feedback signal and the fourth clock signal.

6. The apparatus of claim 5, wherein the buffer model is further configured to provide a default delay responsive to the feedback signal.

7. The apparatus of claim 6, wherein the measurement initialization circuit further comprises:
    a delay clock measurement enable control circuit configured to receive the feedback signal and further configured to provide a delay clock measurement enable control signal responsive to the feedback signal to the buffer model, and
    wherein the buffer model is further configured to provide the default delay amount responsive to the delay clock measurement enable control signal.

8. The apparatus of claim 7, wherein the delay clock measurement enable control circuit is further configured to provide the delay clock measurement enable control signal to a coarse delay, and
    wherein the coarse delay is configured to start the measurement initialization responsive to the delay clock measurement enable control signal, and further configured to stop the measurement initialization responsive to the first stop signal.

9. The apparatus of claim 8, further comprising a shift register circuit configured to provide a variable delay amount during a normal operation,
    wherein the coarse delay is configured to store a first variable delay amount on the shift register circuit, responsive to the first stop signal during the measurement initialization.

10. An apparatus comprising:
    an input stage including a divider configured to receive an internal clock signal having a first frequency and further configured to provide first and second clock signals having a second frequency that is a half of the first frequency;
    a delay stage including:
    a clock enable circuit configured to receive the first and second clock signals from the divider, configured to provide the first clock signal, and further configured to provide third and fourth clock signals having a third frequency that is a half of the second frequency;
    a coarse delay coupled to the clock enable circuit and configured to receive the third clock signal and to provide the third clock signal having an adjustable coarse delay as a first delayed clock signal; and
    a fine delay coupled to the coarse delay, and configured to receive the first delayed clock signal and to provide the first delayed clock signal having an adjustable fine delay as an output clock signal;
    a model delay circuit coupled to the delay stage and configured to receive the output clock signal and provide the output clock signal having a model delay as a feedback signal; and
    a measurement initialization circuit configured to perform measurement initialization with the coarse delay, the measurement initialization circuit comprising:

a stop control circuit configured to provide first and second stop signals responsive to the third and fourth clock signals and further responsive to the feedback signal; and a detection circuit configured to receive the third and fourth clock signals and the first and second stop signals, configured to start detecting a number of cycles of the third frequency responsive to the third and fourth clock signals, and further configured to stop detecting the number of cycles of the third frequency responsive to either the first stop signal or the second stop signal.

11. The apparatus of claim 10, wherein the measurement initialization circuit further comprises a buffer model configured to provide a default delay amount responsive to the feedback signal, wherein the stop control circuit comprises:
first and second synchronizers configured to provide first output signals responsive to the feedback signal and the third clock signal;
third and fourth synchronizers configured to provide second output signals responsive to the feedback signal and the fourth clock signal; and
wherein the detection circuit comprises an adder circuit configured to receive the first output signals and to provide the first stop signal responsive to the first output signals, further configured to receive the second output signals and to provide the second stop signal responsive to the second output signals.

12. The apparatus of claim 10, wherein the detection circuit comprises a plurality of counters,
wherein each counter is configured to receive:
one clock signal of the third and fourth clock signals and complementary signals of the third and fourth clock signals;
a start signal responsive to the received one clock signal; and
either the first stop signal or the second stop signal responsive to the received one clock signal.

13. The apparatus of claim 12, therein each counter of the plurality of counters is a binary counter.

14. The apparatus of claim 12, wherein each counter of the plurality of counters is a shift register circuit.

15. A method comprising:
providing a first clock signals having a first frequency;
delaying a clock signal that is based at least in part on the first clock signal by a delay stage to provide an output clock signal;
delaying the output clock signal by a model delay to provide a feedback signal;
providing third and fourth clock signals having a second frequency that is a half of the first frequency; and receiving the third and fourth clock signals, and complementary clock signals of the third and fourth clock signals respectively by first, second, third and fourth synchronizers;

providing a plurality of first stop signals by the first, second, third and fourth of synchronizers responsive to the feedback signal, the third and fourth clock signals, and complementary clock signals of the third and fourth clock signals; and providing a second stop signal responsive to the plurality of first stop signals to the delay stage, the second stop signal instructing to stop measurement initialization.

16. The method of claim 15, wherein providing the third and fourth clock signals comprises:
delaying the second clock signal from the first clock signal by one cycle of the input clock signal; and
delaying the fourth clock signal from the third clock signal by one cycle of the input clock signal by dividing the second clock signal to generate the fourth clock signal.

17. The method of claim 15, further comprising providing a default delay responsive to the feedback signal.

18. The method of claim 17, wherein providing the default delay comprises:
enabling the first and second synchronizers responsive to the feedback signal and the third clock signal; and
enable the third and fourth synchronizers responsive to the feedback signal and the fourth clock signal.

19. The method of claim 18, further comprising:
receiving the feedback signal;
providing a delay dock measurement enable control signal responsive to the feedback signal; and
providing the default delay responsive to the delay clock measurement enable control signal.

20. The method of claim 19, further comprising:
provide the delay clock measurement enable control signal to a coarse delay;
starting the measurement initialization by the coarse delay responsive to the delay clock measurement enable control signal; and
stopping the measurement initialization by the coarse delay responsive to the second stop signal.

21. The method of claim 15, further comprising:
receiving the third and fourth clock signals and the plurality of first stop signals;
detecting a number of cycles of the second frequency responsive to the third and fourth clock signals; and
stopping detecting the number of cycles of the second frequency responsive to one first stop signal of the plurality of first stop signals.

* * * * *

UNITED STATES PATENT AND TRADEMARK OFFICE
CERTIFICATE OF CORRECTION

PATENT NO. : 11,705,896 B2
APPLICATION NO. : 17/540846
DATED : July 18, 2023
INVENTOR(S) : Yasuo Satoh It is certified that error appears in the above-identified patent and that said Letters Patent is hereby corrected as shown below:

In the Claims

| Column | Line | Claim | Reads | Should Read |
|---|---|---|---|---|
| 15 | 40 | 13 | "The apparatus of claim 12, therein each counter" | --The apparatus of claim 12, wherein each counter-- |
| 16 | 32 | 19 | "providing a delay dock measurement enable control signal" | --providing a delay clock measurement enable control signal-- |

Signed and Sealed this
Twelfth Day of November, 2024

Katherine Kelly Vidal
*Director of the United States Patent and Trademark Office*